Dec. 3, 1968 B. R. KUHL ETAL 3,413,953

SELF-LOCKING KNOB STRUCTURE

Filed Jan. 18, 1965

Inventors:
Bernhard R. Kuhl
Donald H. Larson
By: Hofgren, Wegner, Allen, Stellman & McCord
Attorneys United States Patent Office 3,413,953

Patented Dec. 3, 1968

3,413,953

SELF-LOCKING KNOB STRUCTURE

Bernhard R. Kuhl, Mount Prospect, and Donald H. Larson, Arlington Heights, Ill., assignors to Warwick Electronics Inc., a corporation of Delaware Filed Jan. 18, 1965, Ser. No. 426,302
7 Claims. (Cl. 116—124.1)

ABSTRACT OF THE DISCLOSURE

A knob assembly for multiple tuning mode receivers including a tuning knob having rearwardly extending prongs and rearwardly extending channel-like surfaces and a dial having forwardly extending fingers matingly engageable with the rearwardly extending channels of the knob and further being provided with a midportion terminating in a rearwardly extending shoulder for receiving the rearwardly facing prongs of the knob, the dial being positioned to the interior of a receiver with the guideways and midportion extending forwardly through an opening in the receiver cabinet and the knob being assembled to the dial by being telescoped thereto from the exterior of the cabinet.

This invention relates to knob assemblies and more particularly to a novel means for fastening a tuning knob to associated dial components.

In multi-frequency tuning devices such as combination UHF and VHF television receivers, it has been found to be extremely desirable to locate a substantial portion of the dial indicating equipment to the interior of a television cabinet. Typically such cabinets have an opening serving as a masking means to cooperate with the dials for presenting selected tuning information portions of the dials to view. Portions of the dials as well as the tuning shafts may project to the exterior of the cabinet and have surfaces formed to receive a tuning knob which is telescoped over the dial surfaces or tuning shaft from the exterior of the cabinet. Such an arrangement is disclosed in our copending application entitled, "Multiple High Frequency Tuning Dial Structure," Ser. No. 394,560, filed Sept. 4, 1964, and assigned to the assignee of this invention. With such tuning structures, it has been found that it is extremely desirable to provide a means for securing the knob to the remaining dial components and tuning shafts by means which will prevent the easy axial withdrawal of the knob as well as easy telescoping and securement of the knob to the dials and tuning shafts.

It is therefore a primary object of this invention to provide a new and improved knob assembly.

It is another object of this invention to provide a new and improved knob assembly having positive fastening means on the knob for preventing the facile, axial withdrawal of the knob from the remaining assembly components.

It is yet another object of this invention to provide a new and improved knob assembly for a multiple tuning apparatus having a plurality of dial components positioned to the interior of the tuning apparatus cabinet with portions of the dial components projecting to the exterior thereof wherein the assembly is provided with a tuning knob which is secured to the remaining components from the exterior of the cabinet and wherein the tuning knob is provided with means for firmly securing the knob to the remaining components, which means is yieldable to permit easy telescoping of the knob on the remaining components and wherein further means are provided on the knob and the remaining components for guiding and registering the knob so that the fastening means will be properly positioned relative to the remaining components to insure proper engagement therewith.

Other objects, features and advantages of this invention will be apparent from the following description and from the drawings, in which.

Figures 1, 2, 3, 4, 5, 6, 7, 8:
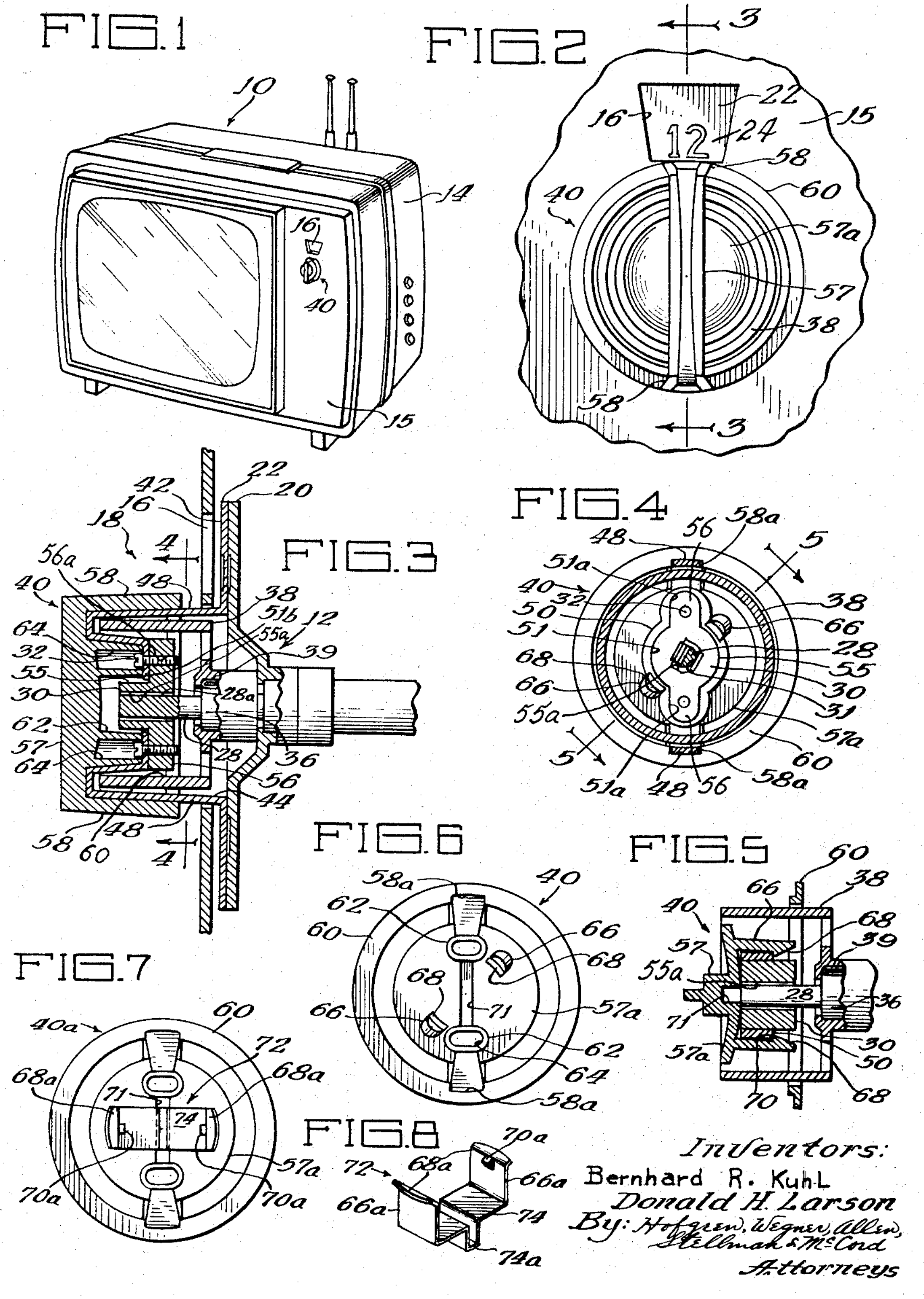
FIGURE 1 is a perspective view of a table model television set embodying the knob apparatus of this invention.
FIGURE 2 is an enlarged view of a portion of the front panel of the set showing the knob in use thereon.
FIGURE 3 is a vertical section view taken through line 3—3 of FIGURE 2.
FIGURE 4 is a section view taken through line 4—4 of FIGURE 3.
FIGURE 5 is a section view taken through line 5—5 of FIGURE 4.
FIGURE 6 is a rear elevational view of the knob of this invention.
FIGURE 7 is a rear elevational view of a knob utilizing a modified movement of this invention.
FIGURE 8 is a perspective view of the clip member used with the modified embodiment shown in FIGURE 7.

Referring now to the drawings, in FIGURE 1 there is shown a table model television set 10 of the type which may be provided with a multiple frequency tuning means (not shown) positioned to the interior of a cabinet 14 having a front wall 15 with a window or opening 16 therein for reading the tuning indicia 24 from the tuner dials. A knob assembly 18 is provided with means for both fine and coarse tuning multiple frequencies, such as UHF and VHF, about a single tuning axis.

UFH dial 20 and VHF dial 22 are substantially disc-like dials having indicia bearing or indicia displaying portions that are mounted in tandem concentrically about the axis of the tuner. A source of illumination in the form of a conventional light bulb (not shown) may be positioned to the rear of the UHF dial for illuminating indicia on the dials. Means is provided for relating the dials and the knob assembly 18 to the tuner apparatus (not shown) so that selective tuning of one of the knobs of the knob assembly about a single tuning axis will either coarse or fine tune the UHF or VHF frequency and information relating to the frequency being tuned as well as the channel within that frequency will be presented to the view of the television viewer. This means and the means by which this information is presented to the viewer is explained in detail in our copending application and will not be further discussed herein except as to the extent that it relates to the present invention.

The tuner includes a VHF coarse tuning shaft 28 provided with a flat portion **28*a* on the periphery of the proximal end thereof to which an interconnecting member 30 is frictionally secured with the aid of leaf spring 31. By means of screws 32, the VHF dial is secured to interconnecting member 30 and therefore to the VHF tuning shaft. The VHF tuning shaft is concentrically rotatably mounted within the multiple tuning shaft 36. This shaft 36 is similarly provided with a flat portion at the proximal end thereof. A multi-tuning knob 38 is secured to the multi-tuning shaft by means of a suitably interposed leaf-spring 39. The knob has an outwardly projecting cylindrical surface for finger manipulation which is nestably received within portions of the VHF dial. A VHF tuning knob 40 is telescoped over portions of VHF dial 22** by means to be explained.

The VHF dial 22 has a flat, disc-like, information bearing surface 42 about a large central opening 44. Extending outwardly from opposite points of the opening 44 are outwardly projecting and inwardly returning fingers or male mating surfaces 48 which are joined to an enlarged bulbous central portion 50 which has a large central opening 51 for receiving an interconnecting member 30. Two opposed smaller bulbous cavities **51*a* are formed at either side of the central opening 51 and have an end wall 51*b*** through which screws 32 extend to secure the VHF dial to the interconnecting member. The side walls of the central portion have a front-to-rear depth which co-operate with the tuning knob 40 in a manner to be explained later for securing the knob to the dial.

The interconnecting member 30 includes a generally bulbous boss 55 projecting into opening 51 and having an opening 55*a* therein for receiving the tuning shaft 28 and the spring 31 to retain the interconnecting means on the shaft. The interconnecting means is further provided with two opposed outwardly extending ears 56 which have threaded openings 56*a* therein for receiving screws 32 to secure the interconnecting means to the mid portion of the VHF dial.

The knob 40 includes a bridge 57 having an inwardly directed leg 58 at either end which support a decorative ring 60 in spaced relation to the bridge 57. The bridge supports a central disc 57*a* on the inside of which there is formed two inwardly directed bosses 62 having hollow openings 64 therein. The bosses have an outer configuration of a size to be received within the cavities 51*a* formed in the mid section of the VHF dial when the knob is telescoped thereover. The inwardly directed legs 58 and the bridge have a grooved channel-like interior 58*a* of a size to slidably receive the outwardly projecting fingers 48 of the VHF dial when the knob is telescoped thereover. The mating fingers and legs and bosses and cavities secure the knob and the dial as a unit for rotation.

Not only do the aforementioned mating surfaces of the two dials serve to secure the knob and dial as a unit for rotation, they also serve to provide a guiding and registering means for properly aligning the dials during telescoping assembly thereof. Such a guiding function is extremely helpful in assembling dials so that the locking means or locking fingers 66 which project inwardly from the dial 40 may be properly positioned relative to the lip portion of the VHF dial to insure locking engagement therewith. The resilient fingers or locking means 66 project inwardly from the opposed points on the peripheral edge of the center disc 57. Preferably the knob 40 is formed of a slightly resilient plastic material. The fingers are provided with inwardly inclined cam surfaces 68 at the free ends thereof which terminate in an undercut lip 70. The cam surfaces serve to spring the fingers outwardly as the knob is slipped over the radially enlarged part of the mid portion of the VHF dial. Once the fingers are moved longitudinally past this radial enlargement, the resilience of the fingers permits them to spring inwardly toward each other and the knob is held to the VHF dial by the lips which engage the rear of the mid portion of the VHF dial. The mating association of the male and female portions of the knob and dial serve to guide the knob for properly aligning the fingers relative to the radial enlargement as well as securing the knob for rotation with the dial. Thesefore, while the knob may be axially withdrawn from the remaining dial components, it requires a relatively strong reverse axial force to accomplish the same so that the knob is relatively securely held to the remaining dial components by a locking means which provides for the easy, axial, telescoping securement of the knob to the components and wherein this act of securement can be accomplished from the exterior of the cabinet while the remaining dial structure may be assembled to the interior of the cabinet with the appropriate portions protruding through the front wall of the cabinet in a position to receive the outermost knob. These fingers with their cam and locking surfaces may be easily formed on the outermost knob structure and satisfactorily co-operate with the existing dial components and structures so as to require no modification of the same nor any change in assembly procedures. Not only is this locking means easily and economically formed, it obviously requires no change in the remaining production or assembly techniques thereby enhancing its value so that it may serve as a more satisfactory and expeditious means for use with such presently known tuning structures as disclosed in our aforementioned co-pending application.

FIGURES 7 and 8 illustrate a modified structure embodying the concept of this invention. Here a separate clip means 72 is provided for securement to the knob. In particular, the clip means 72 is a generally wide angle U-shaped clip having a flat base 74 with a deep relatively narrow centrally disposed notch 74*a* formed therein. The notch is intended to be received within the channel or groove 71 formed on the inside of the bridge 57 for securing the clip 72 to the knob 40. The clip is provided with inwardly directed locking fingers 66*a* which, when the clip is secured to the dial, project inwardly from the dial. These locking fingers are provided with inwardly inclined cam surfaces 68*a* at the free ends thereof. Also, lips 70*a* are formed on the fingers slightly behind and inwardly from the cam surfaces 68*a*. When the clip is secured to the knob, the fingers, cam surfaces and lips all function relative to the radially enlarged part of the VHF dial in the same manner as previously described with reference to the resilient locking fingers 66.

The foregoing detailed description has been given for clearness of understanding only, and no unnecessary limitations should be understood therefrom, as some additional modifications may be obvious to those skilled in the art.

We claim:

1. A tuning knob assembly including a knob having rearwardly facing guideways and rearwardly extending yieldable prongs terminating in radially extending locking surfaces; and a dial having generally forwardly facing guideways matingly engageable with the knob guideways to lock the knob and dial together against relative rotation, the dial further having a midportion between the guideways, the midportion having a rearwardly facing surface interruption for receiving the locking surfaces of the prongs whereby the dial and knob may be telescoped together and locked as a unit against relative rotation and relative axial withdrawal of the knob from the dial.

2. The knob assembly of claim 1 wherein the dial has a radially enlarged face for situation to the interior of a receiver cabinet with the guideways and midportion projecting outwardly from the face for extending through an opening in the receiver cabinet in a position to telescopically receive the knob.

3. The knob assembly of claim 1 wherein the guideways include channels in the knob and outwardly extending fingers of the dial.

4. The knob assembly of claim 3 including a tuning shaft and tuning sleeve about the shaft and wherein another knob is rotatably nested within the dial fingers and connected to the tuning sleeve.

5. The knob assembly of claim 4 wherein the tuning sleeve is connected to a second dial positioned to the rear of the said dial.

6. The knob assembly of claim 5 wherein the said dial midportion is connected to the said dial shaft which projects forwardly of the sleeve.

7. A knob assembly for securing a tuning knob to remaining dial components of a wave signal receiver having a tuning shaft about which said components are secured, comprising: a tuning dial held to said shaft for rotation therewith, said tuning dial having an outwardly extending midportion with an opening through which said shaft extends, said midportion extending axially of the dial and terminating in radial reducement forming a shoulder thereby; supporting fingers connected to said dial and to said midportion for supporting said midportion in spaced relation to said dial, said supporting fingers including an outwardly extending portion connected to the dial and a rearwardly returning portion to which the midportion is secured and an intermediate portion joining said outwardly extending portion and said rearwardly returning portion, said intermediate portion being generally parallel to the face of said dial; and a knob including a base having a channel-like interior and legs extending rearwardly from opposite sides of said base axially toward said dial face, said legs also having a channel-like interior, said channel-like interior of said base and said legs mating with said fingers of said dial to embrace the same when said knob is axially telescoped over said dial to lock the knob for rotation relative to said dial; and a pair of resilient locking fingers extending radially inwardly from said base from opposite sides thereof arcuately offset from said legs, said fingers having inwardly inclined cam surfaces at the ends thereof which terminate in a locking lip of reduced thickness for locking the knob to the shoulder on said midportion.

References Cited

UNITED STATES PATENTS

| | | | |
|---|---|---|---|
| 1,226,161 | 5/1917 | Anthony | 339—91 |
| 1,480,238 | 1/1924 | Burns | 74—553 |
| 1,527,949 | 2/1925 | Burke | 116—124.2 |
| 1,563,351 | 12/1925 | Field et al. | 16—121 |
| 1,563,635 | 12/1925 | Kasch | 74—553 |
| 1,599,034 | 9/1926 | Weston | 116—124.2 |
| 2,706,774 | 4/1955 | Bowman | 74—553 |
| 3,010,743 | 11/1961 | Bengtson | 287—53 |
| 3,236,204 | 2/1966 | Joseph | 116—124.1 |

LOUIS J. CAPOZI, *Primary Examiner.*